United States Patent
Takeuchi et al.

(10) Patent No.: US 10,966,465 B2
(45) Date of Patent: Apr. 6, 2021

(54) NON-COMBUSTION-TYPE FLAVOR INHALER, METHOD, PROGRAM, AND RECORDING MEDIUM

(71) Applicant: JAPAN TOBACCO INC., Tokyo (JP)

(72) Inventors: Manabu Takeuchi, Tokyo (JP); Takuma Nakano, Tokyo (JP); Manabu Yamada, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 296 days.

(21) Appl. No.: 16/104,051

(22) Filed: Aug. 16, 2018

(65) Prior Publication Data

US 2018/0352864 A1 Dec. 13, 2018

Related U.S. Application Data

(63) Continuation of application No. PCT/JP2017/005563, filed on Feb. 15, 2017.

(30) Foreign Application Priority Data

Feb. 16, 2016 (WO) .................. PCT/JP2016/054488

(51) Int. Cl.
*G01R 31/04* (2006.01)
*A24F 47/00* (2020.01)
(Continued)

(52) U.S. Cl.
CPC .......... *A24F 47/008* (2013.01); *A24B 15/167* (2016.11); *A24D 1/002* (2013.01);
(Continued)

(58) Field of Classification Search
CPC .......... A24F 47/00; A24F 47/008; A24F 7/00; G01R 31/66; G01R 31/69; G01R 31/70;
(Continued)

(56) References Cited

U.S. PATENT DOCUMENTS 6,104,888 A 8/2000 Kobayashi
7,689,134 B2 3/2010 Inukai
(Continued)

FOREIGN PATENT DOCUMENTS

CN 105163610 A 12/2015
JP 11-143304 A 5/1999
(Continued)

OTHER PUBLICATIONS

Extended European Search Report, dated Aug. 9, 2019, for European Application No. 17753235.5.
(Continued)

*Primary Examiner* — Son T Le
(74) *Attorney, Agent, or Firm* — Birch, Stewart, Kolasch & Birch, LLP

(57) ABSTRACT

A non-combustion-type flavor inhaler includes a first unit including a battery configured to store electric power, a generator configured to generate an inhalant ingredient from an inhalant ingredient source by electric power provided from the battery, and a controller configured to electrically control the generator; a second unit configured to detachably connect to the first unit; and a resistor configured to conductively connect to the generator by parallel connection or serial connection when the second unit is connected to the first unit. The controller is configured to detect a connection between the first unit and the second unit based on a difference between an electric resistance value (R1) of the generator and a combined resistance value (Rc) of the generator and the resistor.

27 Claims, 9 Drawing Sheets

(51) Int. Cl.
  *G01R 31/69* (2020.01)
  *A24B 15/167* (2020.01)
  *A24D 1/00* (2020.01)
  *A24F 7/00* (2006.01)

(52) U.S. Cl.
  CPC ............... *A24F 7/00* (2013.01); *A24F 47/00* (2013.01); *G01R 31/69* (2020.01)

(58) Field of Classification Search
  CPC ............ G01R 31/364; G01R 31/2812; G01R 17/105; G01R 27/20; G01R 27/205; A24B 15/167; A24D 1/002
  See application file for complete search history.

(56) References Cited

U.S. PATENT DOCUMENTS

| | | | |
|---|---|---|---|
| 9,730,473 B2 | 8/2017 | Shinkawa et al. | |
| 2011/0011396 A1* | 1/2011 | Fang | A24F 47/002 128/202.21 |
| 2014/0253144 A1 | 9/2014 | Novak, III et al. | |
| 2014/0299141 A1 | 10/2014 | Flick | |
| 2015/0075545 A1 | 3/2015 | Xiang | |
| 2015/0223522 A1 | 8/2015 | Ampolini et al. | |
| 2018/0310621 A1* | 11/2018 | Borkovec | A24B 15/167 |

FOREIGN PATENT DOCUMENTS

| | | |
|---|---|---|
| JP | 2002-258688 A | 9/2002 |
| JP | 2007-121551 A | 5/2007 |
| JP | 2014-530632 A | 11/2014 |
| TW | 201528977 A | 8/2015 |
| WO | WO 2015/046385 A1 | 4/2015 |

OTHER PUBLICATIONS

International Search Report for PCT/JP2017/005563 (PCT/ISA/210) dated May 9, 2017.
Taiwanese Office Action issued in Patent Application No. 106105054 dated Nov. 10, 2017.

* cited by examiner

NON-COMBUSTION-TYPE FLAVOR INHALER, METHOD, PROGRAM, AND RECORDING MEDIUM

CROSS REFERENCE TO RELATED APPLICATIONS

This application is a Continuation of PCT International Application No. PCT/JP2017/005563, filed on Feb. 15, 2017, which claims priority under 35 U.S.C. 119(a) to Patent Application No. PCT/JP2016/054488, filed in Japan on Feb. 16, 2016, all of which are hereby expressly incorporated by reference into the present application.

TECHNICAL FIELD

The present invention relates to a non-combustion-type flavor inhaler provided with a generator that generates an inhalant ingredient from an inhalant ingredient source by electric power without combustion, a method for detecting a connection related to the non-combustion-type flavor inhaler, a program for executing the method, and a recording medium.

BACKGROUND ART

Instead of cigarettes, non-combustion-type flavor inhalers for tasting flavors without combustion flavor sources like tobacco have been proposed. Patent Literature 1 discloses a non-combustion-type flavor inhaler that includes a main body unit and a capsule unit detachably connected to the main body unit. The main body unit includes an aerosol generation source that generates aerosol, an atomization unit that atomizes the aerosol generation source without combustion, and an electric power source that supplies electric power to the atomization unit. The capsule unit includes a flavor source that generates a flavor to be inhaled by a user.

PRIOR ART DOCUMENT

Patent Document

Patent Literature 1: International Publication No. 2015/046385

SUMMARY

A first feature is a non-combustion-type flavor inhaler comprising: a first unit including a battery configured to store electric power, a generator configured to generate an inhalant ingredient from an inhalant ingredient source by electric power provided from the battery, and a controller configured to electrically control the generator; a second unit configured to detachably connect to the first unit; and a resistor configured to conductively connect to the generator by parallel connection or serial connection when the second unit is connected to the first unit. The controller is configured to detect a connection between the first unit and the second unit based on a difference between an electric resistance value of the generator and a combined resistance value of the generator and the resistor.

The second feature is the non-combustion-type flavor inhaler according to the first feature, wherein the generator of the first unit includes an aerosol source configured to generate aerosol, and the second unit includes a flavor source configured to generate flavor.

The third feature is the non-combustion-type flavor inhaler according to the second feature, wherein the aerosol source is a liquid at ordinary temperatures, and the flavor source is a solid at ordinary temperatures.

The fourth feature is the non-combustion-type flavor inhaler according to the second feature or the third feature, wherein the aerosol source contains polyhydric alcohol, and the flavor source contains a plant material.

The fifth feature is the non-combustion-type flavor inhaler according to any one of the first feature to the fourth feature, wherein the controller is configured to perform control of an amount of electric power to supply to the generator or notification control of a notification means provided in the non-combustion-type flavor inhaler, after detecting a connection between the first unit and the second unit.

The sixth feature is the non-combustion-type flavor inhaler according to any one of the first feature to the fifth feature, wherein an electrical resistance value of the generator is different from an electrical resistance value of the resistor.

The seventh feature is the non-combustion-type flavor inhaler according to any one of the first feature to the sixth feature, further comprising an electrical path configured to electrically connect the resistor and the generator in parallel, wherein a part of the electrical path is provided in the second unit, and in the electrical path, the resistor is provided on the second unit side of the generator.

The eighth feature is the non-combustion-type flavor inhaler according to the seventh feature, wherein the resistor is provided in the second unit.

The ninth feature is the non-combustion-type flavor inhaler according to the seventh feature of the eighth feature, wherein a ratio of the electrical resistance value of the resistor with respect to the electrical resistance value of the generator is 5 to 100.

The tenth feature is the non-combustion-type flavor inhaler according to any one of the first feature to the sixth feature, further comprising an electrical path configured to electrically connect the generator and the resistor in series, wherein a part of the electrical path is provided in the second unit, and the resistor is provided in the second unit.

The eleventh feature is the non-combustion-type flavor inhaler according to the tenth feature, wherein a ratio of the electrical resistance value of the resistor with respect to the electrical resistance value of the generator is 0.01 to 0.25.

The twelfth feature is the non-combustion-type flavor inhaler according to the tenth feature or the eleventh feature, further comprising a third unit configured to detachably connect to the first unit when the second unit is not attached to the first unit, the third unit being not a detection target, wherein when the second unit is not attached to the first unit, the electrical path on the first unit side is opened at a pair of electric terminals, and the third unit is configured to cause the pair of electric terminals to conductively connect with each other with an electrical resistance value smaller than an electrical resistance value of the resistor.

The thirteenth feature is the non-combustion-type flavor inhaler according to any one of the first feature to the twelfth feature, wherein the generator includes a resistance heating element.

The fourteenth feature is the non-combustion-type flavor inhaler according to any one of the first feature to the thirteenth feature, further comprising a known resistor configured to electrically connect to the generator and the resistor in series, the known resistor having a known electrical resistance value, wherein the controller is configured to estimate the combined resistance value using an electrical resistance value of the known resistor.

The fifteenth feature is the non-combustion-type flavor inhaler according to any one of the second feature to the fourth feature, wherein the resistor is segmented from a retainer retaining the flavor source.

The sixteenth feature is the non-combustion-type flavor inhaler according to any one of the second feature to the fourth feature, and the fifteenth feature, wherein the resistor does not substantially contribute to aerosol generating from the flavor source.

The seventeenth feature is the non-combustion-type flavor inhaler according to any one of the second feature, the fourth feature, the fifteenth feature, and the sixteenth feature, wherein the resistor does not substantially contribute to heating of the flavor source.

The eighteenth feature is the non-combustion-type flavor inhaler according to any one of the first feature to the seventeenth feature, wherein the first unit includes an information source configured to hold an electrical resistance value of the generator or identification information correlated with an electrical resistance value of the generator.

The nineteenth feature is the non-combustion-type flavor inhaler according to any one of the first feature to the eighteenth feature, wherein the controller is configured to prohibit electric power supply to the generator when a difference between the combined resistance value and an electrical resistance value of the generator is equal to or smaller than a predetermined threshold.

The twentieth feature is the non-combustion-type flavor inhaler according to any one of the first feature to the nineteenth feature, wherein the first unit includes a generation unit and a battery unit, the generation unit including at least the generator, the battery unit including at least the battery, and the generation unit is configured to detachably connect to the battery unit.

The twenty first feature is the non-combustion-type flavor inhaler according to the twentieth feature, wherein the generation unit includes a first electrode electrically connected to a cathode of the battery and a second electrode electrically connected to an anode of the battery, and the generator and the resistor are electrically connected to the battery via the first electrode and the second electrode.

The twenty second feature is the non-combustion-type flavor inhaler according to the twenty first feature, wherein the generation unit includes a third electrode electrically connected to the cathode of the battery, and memory storing information indicating the electrical resistance value of the generator, and the memory is electrically connected to the battery via the third electrode and the second electrode.

The twenty third feature is the non-combustion-type flavor inhaler according to any one of the first feature to the twenty second feature, wherein the second unit includes a mouthpiece.

The twenty fourth feature is the non-combustion-type flavor inhaler according to any one of the first feature to the twenty third feature, further comprising: a first electric current path configured to generate the inhalant ingredient from the inhalant ingredient source; a second electric current path configured to measure an electrical resistance value of the generator, or a combined resistance value of the generator and the resistor; and a switch means configured to be switchable between the first electric current path and the second electric current path for selectively flowing an electric current therethrough.

The twenty fifth feature is a method for detecting a connection of a first unit and a second unit in a non-combustion-type flavor inhaler that comprise the first unit and the second unit, the first unit including a generator configured to generate an inhalant ingredient from an inhalant ingredient source, the second unit detachably connecting to the first unit, the method comprising: detecting a connection between the first unit and the second unit based on a difference between an electrical resistance value of the generator and a combined resistance value of the generator and a resistor conductively connected in parallel or in series to the generator when the second unit is connected to the first unit.

The twenty sixth feature is a program that causes a non-combustion-type flavor inhaler to execute the method according to the twenty fifth feature.

The twenty seventh feature is a recording medium that stores a program for executing the method according to the twenty fifth feature.

DESCRIPTION OF THE EMBODIMENT

Figure 1:
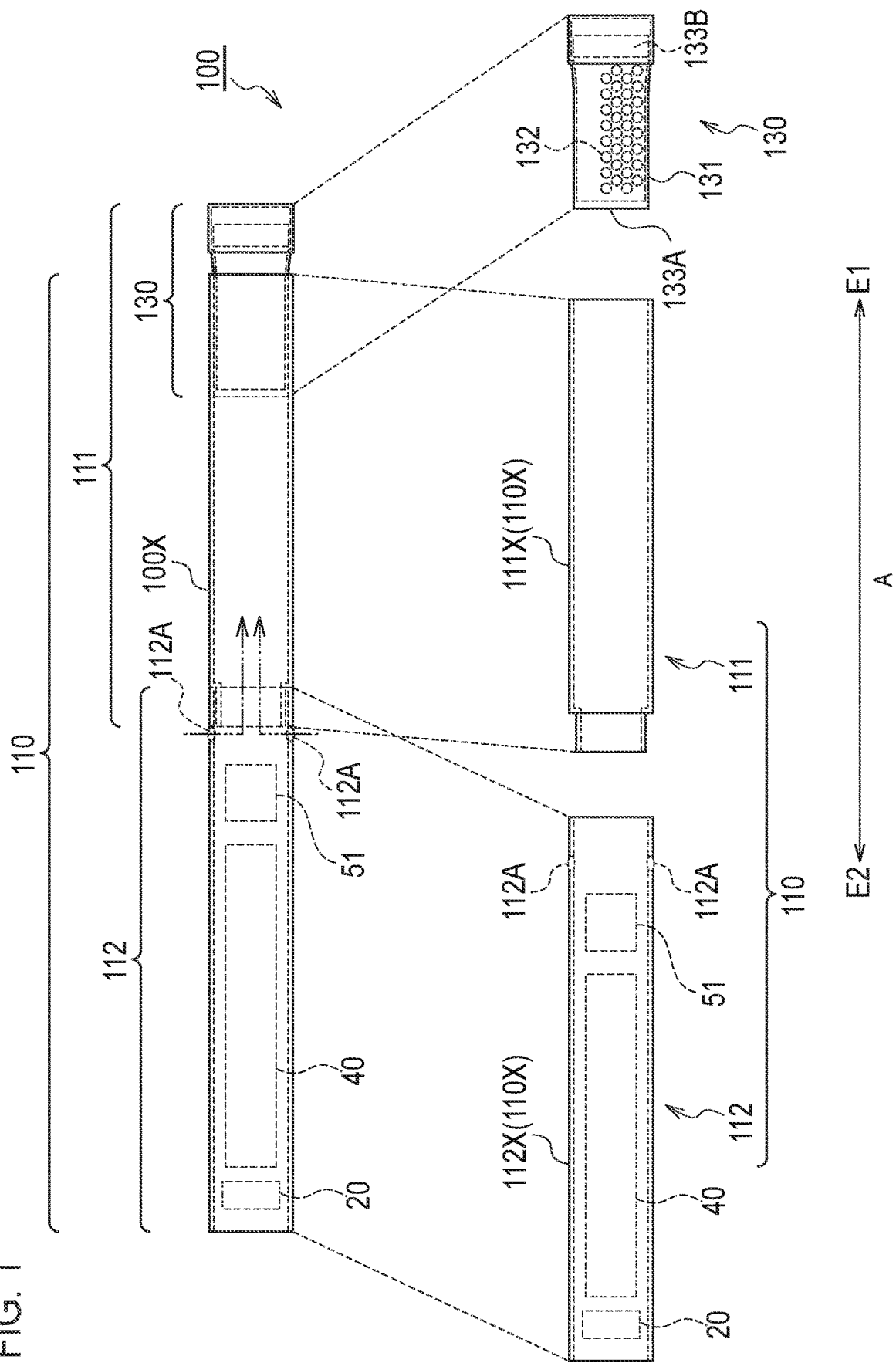
FIG. 1 is a diagram illustrating a non-combustion-type flavor inhaler according to a first embodiment.

Hereinafter, embodiments will be described. In the description of the drawings below, the same or similar parts will be denoted by the same or similar reference numerals. The drawings are merely illustrative and dimension and ratios, etc. of parts may be different from those of the actual ones.

Actual dimensions, etc. need to be determined with reference to the following description. Also, dimensions and ratios of parts may be different from one another among other drawings.

Overview of Disclosure

Regarding the technique described in Patent Literature 1, there is an increasing demand for the improvement in usability in market.

A non-combustion-type flavor inhaler according to the overview of the disclose comprising: a first unit including a battery configured to store electric power, a generator configured to generate an inhalant ingredient from an inhalant ingredient source by electric power provided from the battery, and a controller configured to electrically control the generator; a second unit configured to detachably connect to the first unit; and a resistor configured to conductively connect to the generator by parallel connection or serial connection when the second unit is connected to the first unit. The controller is configured to detect a connection between the first unit and the second unit based on a difference between an electric resistance value of the generator and a combined resistance value of the generator and the resistor.

According to the overview of the disclosure, the controller detects a connection between a first unit and a second unit based on a difference between a combined resistance value of a generator and a resistor and a resistance value of the generator. Therefore, for example, it is possible to change an amount of electric power to be supplied to the generator depending on presence or absence of the connection of the second unit, and stop electric power supply to the generator when the second unit is not connected to the first unit. Also, the resistor used to detect the connection of the second unit is connected to the generator in parallel or in series. Therefore, a part of an electric circuit from the battery and/or the controller to the resistor can be shared with an electric circuit that supplies electric power to the generator.

First Embodiment

Non-Combustion-Type Flavor Inhaler

Figure 2:
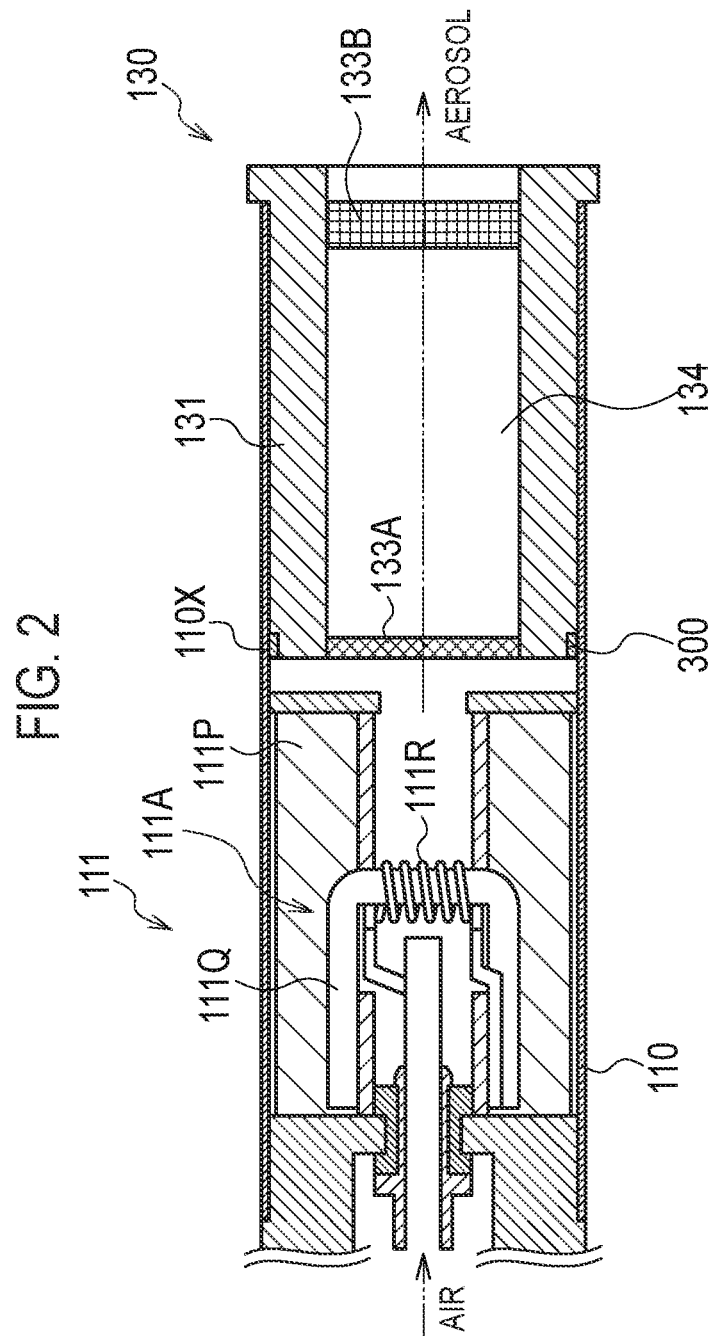
FIG. 2 is a diagram illustrating a generation unit according to the first embodiment.
Figure 3:
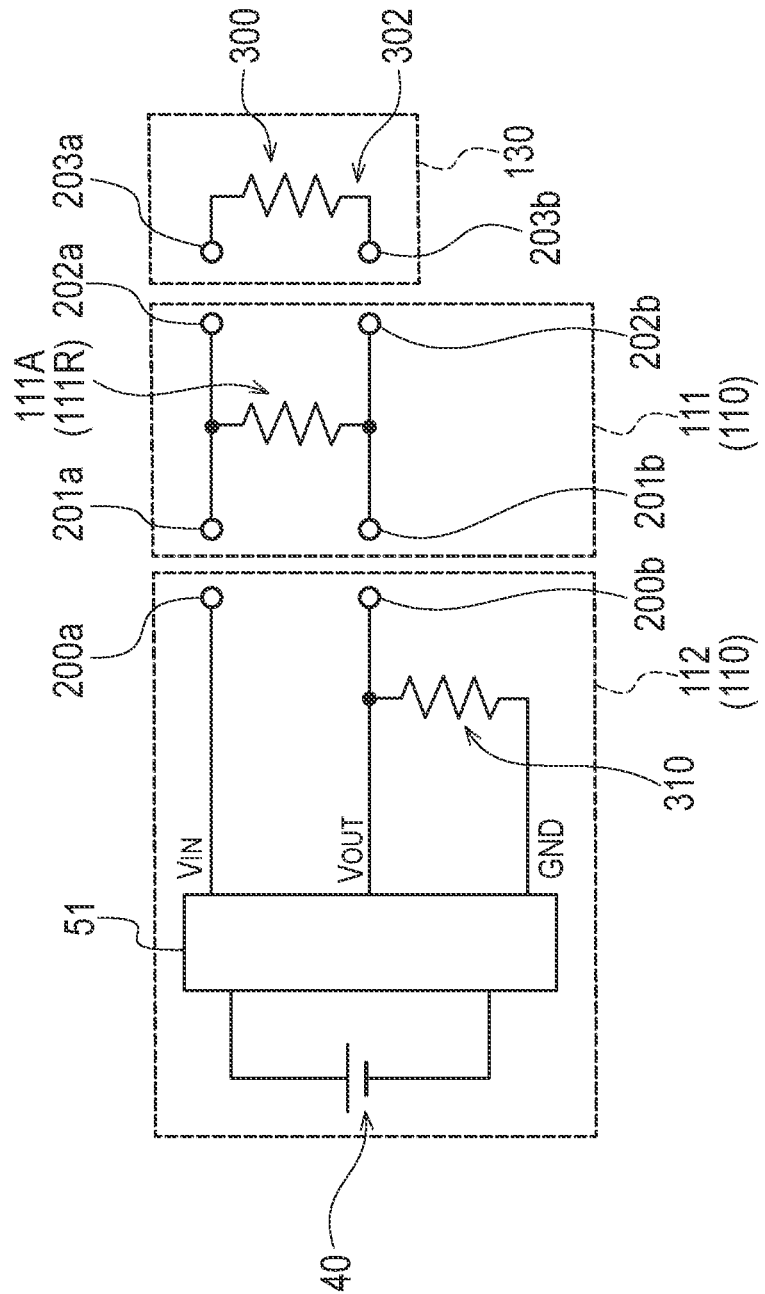
FIG. 3 is a diagram schematically illustrating an electric circuit provided in the non-combustion-type flavor inhaler according to the first embodiment.

Hereinafter, a non-combustion-type flavor inhaler according to a first embodiment will be described. FIG. 1 is a diagram illustrating a non-combustion-type flavor inhaler 100 according to the first embodiment. FIG. 2 is a diagram illustrating a generation unit forming the non-combustion-type flavor inhaler 100. FIG. 3 is a diagram schematically illustrating an electric circuit provided in the non-combustion-type flavor inhaler 100.

The non-combustion-type flavor inhaler 100 is a device with which a user inhales an inhalant ingredient (a flavor ingredient) without combustion. The non-combustion-type flavor inhaler 100 may have a shape extending along a predetermined direction A that is a direction toward a mouthpiece end E1 from a non-mouthpiece end E2. Hereinafter, the non-combustion-type flavor inhaler 100 may be simply referred to as a flavor inhaler 100.

The flavor inhaler 100 includes a first unit 110 and a second unit 130. The first unit 110 is detachably connected to the second unit 130. More specifically, the first unit 110 includes a cylindrical body 110X, and the second unit 130 is detachably connected to a mouthpiece end of the cylindrical body 110X.

The first unit 110 includes a battery 40 in which electric power is stored, a generator 111A that generates the inhalant ingredient from the inhalant ingredient source by electric power supplied from the battery 40, and a controller 51 that electrically controls the generator 111A.

The first unit 110 may be separated into a generation unit 111 that includes at least the generator 111A, and a battery unit 112 that includes at least the battery 40. The generation unit 111 is detachably connected to the battery unit 112. The controller 51 is provided in the battery unit 112. Alternatively, the controller 51 may be provided in the generation unit 112.

The battery unit 112 includes a cylindrical body 112X that forms a part of the cylindrical body 110X. The battery 40 and the controller 51 are housed in the cylindrical body 112X. The battery 40 may be, for example, a lithium ion battery. The controller 51 includes, for example, a CPU and memory. The electric circuit provided in the flavor inhaler 100 will be described below (see FIG. 3).

The battery unit 112 includes an air vent 112A. Air introduced through the air vent 112A is guided to the generation unit 111 as illustrated in FIG. 2.

The battery unit 112 may have a sensor 20 that detects inhalation action by a user. The sensor 20 includes a capacitor, for example, and outputs a value indicating electric capacity of the capacitor in accordance with a differential pressure caused by the inhalation. For example, the value may be a voltage value.

Any types of generators may be used as the generator 111A forming the generation unit 111 that generates an inhalant ingredient from the inhalant ingredient source. For example, the generator 111A may generate aerosol as an inhalant ingredient from an aerosol source as an inhalant ingredient source.

Hereinafter, an example of a configuration of the generation unit 111 provided with an aerosol source as the generator 111A will be described with reference to FIG. 2. The generation unit 111 includes the cylindrical body 111X that forms a part of the cylindrical body 110X.

The generator 111A includes a reservoir 111P, a wick 111Q, and a resistor 111R. The reservoir 111P, the wick 111Q, and the resistor 111R are housed in the cylindrical body 111X. The reservoir 111P retains the aerosol source. The reservoir 111P is a porous body formed by, for example, materials like a resin web. The wick 111Q is an example of a liquid hold member bolding the aerosol source supplied from the reservoir 111P. The wick 111Q is formed by, for example, glass fiber.

The resistor 111R may be a resistance heating element. The resistance heating element atomizes the aerosol source held by the wick 111Q. For example, the resistance heating element is formed by a resistance heating element wound around the wick 111Q at a predetermined pitch (e.g., heating wire).

The aerosol source may be a liquid at ordinary temperatures. The aerosol source may be, for example, polyhydric alcohol. The polyhydric alcohol desirably at least one compound selected from a group consisting of glycerin, propylene glycol, 1,3-propanediol, 1,3-butanediol, and sorbitol. As described above, the aerosol source is held by, for example, a porous body formed by materials like a resin web. The porous body may be made of a non-tobacco material or may be made of a tobacco material. The aerosol source may contain nicotine. Alternatively, the aerosol source does not contain nicotine. The aerosol source may contain ingredients other than nicotine. Alternatively, the aerosol source does not contain ingredients other than nicotine.

The second unit 130 is connectable to the first unit 110 that forms the flavor inhaler 100. In the present embodiment, the second unit 130 is provided farther toward the mouthpiece side than the generation unit 111. However, the second unit 130, does not necessarily have to be provided farther toward the mouthpiece side than the generation unit 111 physically and spatially. For example, the second unit 130 may be detachably connected to the mouthpiece end side of the first unit 110.

In the example described in the present embodiment, the second unit 130 includes a cylindrical body 131, a flavor source 132, a mesh 133A, and a filter 133B. The cylindrical body 131 has a cylindrical shape extending in the predetermined direction A. The cylindrical body 131 includes a retainer 134 that retains the flavor source 132.

The flavor source 132 is provided farther toward the mouthpiece than the generation unit 111 on a flow path of air inhaled from the mouthpiece. The flavor source 132 applies a flavor ingredient to the aerosol generated in the aerosol source of the generation unit 111. The flavor to be applied to the aerosol by the flavor source 132 is carried to the mouthpiece of the flavor inhaler 100.

The flavor source 132 is a solid at ordinary temperatures. The ordinary temperatures in the present invention are in the range of from 5 to 35 degrees. C. according to JIS Z 8703. The flavor source 132 is a plant material. In the embodiments, the flavor source 132 is formed by material pieces of a plant material that provides a flavor ingredient to the aerosol. The size of the material piece is preferably equal to or greater than 0.2 mm and equal to or smaller than 1.2 mm. Further, the size of the material piece is preferably equal to or greater than 0.2 mm and equal to or smaller than 0.7 mm. The smaller the size of the material pieces forming the flavor source 132, the larger a specific surface area becomes. Therefore, the flavor ingredient is more easily released from the pieces of materials forming the flavor source 132. Therefore, when applying a desired amount of flavor ingredient to the aerosol, the amount of the pieces of the flavor ingredient can be reduced. As the raw material pieces that form the flavor source 132, a compact formed by molding a tobacco material, e.g., cut tobacco and a tobacco raw material, in a granular form may be used. Alternatively, the flavor source 132 may be a compact in which a tobacco material is pressed as a sheet. Also, the raw material pieces forming the flavor source 132 may be formed by plants other than tobacco (e.g., mint and herb). Flavors, e.g., menthol may be applied to the flavor source 132.

A mesh 133A is provided to block an opening of the cylindrical body 131 on the non-mouthpiece side with respect to the flavor source 132. A filter 133B is provided to block an opening of the cylindrical body 131 on the mouthpiece side with respect to the flavor source 132. The mesh 133A has a degree of coarseness that the raw material pieces forming the flavor source 132 do not pass through the mesh 133A. The apertures of the mesh 133A are, for example, equal to or greater than 0.077 mm and equal to or smaller than 0.198. The filter 133B is formed by a material having ventilation. The filter 133B is desirably an acetate filter, for example. The filter 133B has a degree of coarseness that the raw material pieces forming the flavor source 132 do not pass through the filter 133B.

In the first embodiment, as illustrated in FIG. 2, the second unit 130 includes a resistor 300 described below. An electrical resistance value of the resistor 300 may be different from an electrical resistance value of the generator 111A and, in particular, may be smaller than the electrical resistance value of the generator 111A. In the present embodiment, the resistor 300 does not substantially contribute to heating of the flavor source 132. In the embodiment illustrated in FIG. 2, the resistor 300 is segmented by the retainer 134 retaining the flavor source 132.

The resistor 300 may be provided in contact with the cylindrical body 131 as illustrated in FIG. 2 or, alternatively, may be positioned physically separated from the cylindrical body 131. In particular, the resistor 300 may be coated with an insulating material. Therefore, even if the resistor 300 generates heat, the heat generated in the resistor 300 is not easily transferred to the flavor source 132.

The cylindrical body 131 may be made of, for example, a non-metallic substance or a resin material. The resin material may be, for example, polyethylene, polypropylene and polyetheretherketone.

Thermal conductivity of the cylindrical body 131 is preferably equal to or less than 1 W/(m·K), and more preferably equal to or less than 0.5 W/(m·K).

In the form illustrated in FIG. 2, the resistor 300 is provided separately from the cylindrical body 131. Alternatively, the resistor 300 may be integrated with the cylindrical body 131 that contains the flavor source. That is, the cylindrical body 131 itself may be made of a material that functions as the resistor 300 having a predetermined electrical resistance value.

Electrical Configuration of Flavor Inhaler

Next, an electric circuit provided in the flavor inhaler 100 will be described with reference to FIG. 3.

The battery unit 112 includes electric terminals 200a and 200b to be electrically connected to the generation unit 111. The generation unit 111 includes electric terminals 201a and 201b to be electrically connected to the battery unit 112. The electric terminal 201a includes a first electrode to be electrically connected to an anode of the battery 40. The electric terminal 201b includes a second electrode electrically connected to the anode of the battery. When the generation unit 111 and the battery unit 112 are mechanically connected to each other, the battery 40 and the controller 51 are electrically connected to the resistance heating element 111R of the generator 111A via the electric terminals 200a, 200b, 201a, and 201b. The battery 40 supplies electric power to the resistance heating element 111R via the controller 51.

The generation unit 111 includes electric terminals 202a and 202b with which the generation unit 111 is electrically connected to the second unit 130. The second unit 130 includes electric terminal 203a and 203b with which the second unit 130 is electrically connected to the generation unit 111. When the first unit 110 and the second unit 130 are mechanically connected to each other, the electric terminals 201a and 201b and the electric terminals 202a and 202b are electrically connected to each other.

The flavor inhaler 100 includes the resistor 300 that is conductively connected to the generator 111A in parallel when the second unit 130 is connected to the first unit 110. In particular, the flavor inhaler 100 includes an electrical path 302 that electrically connects the generator 111A and the resistor 300 in parallel, and a part of the electrical path 302 is provided in the second unit 130. The resistor 300 is provided on the second unit 130 side of the generator 111A on the electrical path 302.

In the present embodiment, electric terminals 202a, 202b, 203a, and 203b which electrically connect the first unit 110 to the second unit 130 are provided on the electrical path 302 on which the generator 111A and the resistor 300 are electrically connected in parallel. The resistor 300 is provided in the second unit 130. Since the resistor 300 is connected in parallel with the generator 111A, a voltage substantially equal to a voltage value to be applied to the generator 111A ($V_{IN}-V_{OUT}$) is applied to the resistor 300.

The flavor inhaler 100 may include a known resistor 310 that is electrically connected to the generator 111A and the resistor 300 in series and has a known electrical resistance value. The known resistor 310 is desirably provided in the battery unit 112. A voltage equivalent to a difference between an output voltage $V_{OUT}$ of the generator 111A and a ground electrode is applied to the known resistor 310.

Detection of Connection of Second Unit

The controller 51 detects a connection between the first unit 110 and the second unit 130 based on a difference between a combined resistance value Rc of the generator 111A and the resistor 300 and the electrical resistance value R1 of the generator 111A. When the second unit 130 is not connected to the first unit 110, the electrical resistance value of the electric circuit to be connected to the electric terminal 200a and the electric terminal 200b of the battery unit 112 is substantially the same as the electrical resistance value R1 of the generator 111A. When the second unit 130 is connected to the first unit 110, an electrical resistance value of an electric circuit connected to the electric terminal 200a and the electric terminal 200b of the battery unit 112 is substantially the combined resistance value Rc (<R1) of the electrical resistance value R1 of the generator 111A and an electrical resistance value R2 of the resistor 300. Therefore, the controller 51 can detect whether the second unit 130 has been connected to the first unit 110 based on a difference between the electrical resistance value R1 of the generator 111A and the combined resistance value Rc.

As a specific example, the controller 51 can detect whether the second unit 130 has been connected to the first unit 110 in the following manner. First, when the second unit 130 is not connected to the first unit 110, the controller 51 measures the electrical resistance value R1 of the generator 111A. The electrical resistance value R1 is stored in the memory of the controller 51. The controller 51 measures the electrical resistance value of the electric circuit connected to the electric terminal 200a and the electric terminal 200b at predetermined timing. When the second unit 130 is connected to the first unit 110, the electrical resistance value becomes the combined resistance value Rc (<R1). When the controller 51 detects an electrical resistance value smaller than the electrical resistance value R1, the controller 51 determines that the second unit 130 has been connected to the first unit 110. In consideration of measurement accuracy of the electrical resistance value, the controller 51 may determine that the second unit 130 has been connected to the first unit 110 when the controller 51 detects an electrical resistance value sufficiently smaller than the electrical resistance value R1.

The timing at which the controller 51 measures the electrical resistance value of the electric circuit connected to the electric terminal 200a and the electric terminal 200b is desirably the timing at which a user performs an inhalation action. That is, the controller 51 measures the electrical resistance value when the sensor 20 detects an inhalation action.

Alternatively, the controller 51 may measure the electrical resistance value of the electric circuit connected to the electric terminal 200a and the electric terminal 200b when a user presses a switch, e.g., a button, for driving the generator 111A. The controller 51 may measure the electrical resistance value of the electric circuit connected to the electric terminal 200a and the electric terminal 200b, at each predetermined time interval.

The controller 51 may measure the electrical resistance value of the electric circuit connected to the electric terminal 200a and the electric terminal 200b when a mode is switched from a sleep mode (an electric power-saving mode) in which no electric conduction of the generator 111A is allowed to a ready mode in which the generator 111A is controllable. Switching from the sleep mode to the ready mode is executed when, for example, the button is pressed for predetermined time or longer in the sleep mode, or when an inhalation action of a specific pattern is performed by a user in the sleep mode (e.g., the user inhales about two seconds for three times in predetermined time).

Further, when the flavor inhaler has a user authentication function, the controller 51 may measure the electrical resistance value of the electric circuit connected to the electric terminal 200a and the electric terminal 200b at timing at which an action for the user authentication is performed. The user authentication may be performed by, for example, detecting characteristics of the inhalation action by the user by the sensor 20. However, the user authentication method is not limited to that described in this example.

The electrical resistance value of the electric circuit connected to the electric terminal 200a and the electric terminal 200b can be measured as follows. First, an input voltage $V_{IN}$ to the generator 111A and an output voltage $V_{OUT}$ of the generator 111A (an input voltage of the known resistor 310) are measured. An electrical resistance value R of the electric circuit connected to the electric terminal 200a and the electric terminal 200b is calculated by using the following equation using the voltage values $V_{IN}$ and $V_{OUT}$ and the electrical resistance value R3 of the known resistor 310:

$$R=((V_{IN}-V_{OUT})/V_{OUT})\times R3.$$

When the second unit 130 is not connected to the first unit 110, the electrical resistance value R1 of the generator 111A is substantially calculated from the equation above. Further, when the second unit 130 is connected to the first unit 110, the combined resistance value Rc is substantially calculated from the equation above.

As discussed above, the controller 51 desirably estimates the combined resistance value Rc by using the electrical resistance value R3 of the known resistor 310. The arrangement of the known resistor 310 illustrated in FIG. 3 is an example. The known resistor 310 may be arranged at an arbitrary point on the electric circuit if the electrical resistance value R1 of the generator 111A, and the combined resistance value Rc of the generator 111A and the resistor 300 are measurable. The electrical resistance value R3 of the known resistor 310 may be in a range from 10 mΩ to 100 mΩ.

From the viewpoint of improving detection accuracy as to whether the second unit 130 has been connected, the smaller the difference between the electrical resistance value R1 of the generator 111A and the combined resistance value Rc is the better. From this viewpoint, a ratio of the electrical resistance value R2 of the resistor 300 with respect to the electrical resistance value R1 of the generator 111A is preferably equal to or smaller than 100, and more preferably equal to or smaller than 50.

From the viewpoint of reducing electric power consumption during the use of the flavor inhaler 100, the larger the electrical resistance value R2 of the resistor 300 is the better. From this viewpoint, a ratio of the electrical resistance value R2 of the resistor 300 with respect to the electrical resistance value R1 of the generator 111A is preferably equal to or greater than 5, and more preferably equal to or greater than 10.

After detecting the connection between the first unit 110 and the second unit 130, the controller 51 may perform control of the amount of electric power supplied to the generator 111A or notification control of a notification means provided in the non-combustion-type flavor inhaler. The notification means may be, for example, a light-emitting element, a voice and sound output device, and a sense feedback device like Haptics. When a sense feedback device is used as a notification means, a vibrating element, for example, may be provided and notification may be performed with propagation of vibration to the user.

The controller 51 may prohibit electric power supply to the generator 111A when the difference between the combined resistance value Rc and the electrical resistance value R1 of the generator 111A is equal to or lower than a first predetermined threshold. Therefore, the flavor inhaler 100 may be not usable when the second unit 130 is not connected to the first unit 110. Further, unlike the authentic second unit 130, when an inauthentic part provided without the resistor 300 is connected to the first unit 110, it is possible to prohibit the use of an inauthentic device by not supplying electric power to the generator 111A.

Also, the controller 51 may prohibit electric power supply to the generator 111A when the difference between the combined resistance value Rc and the electrical resistance value R1 of the generator 111A is equal to or greater than a predetermined second threshold (which is greater than the above-described first threshold). Therefore, when a short-circuit is caused between the electric terminal 202a and the electric terminal 202b electric power supply to the generator 111A can be stopped.

Further, the controller 51 may stop electric power supply to the generator 111A when the difference between the combined resistance value Rc and the electrical resistance value R1 of the generator 111A is equal to or smaller than the above-described predetermined first threshold or equal to or greater than the above-described predetermined second threshold. Therefore, when an inauthentic product provided with a resistor having an electrical resistance value different from an electrical resistance value of the resistor 300 of an authentic product is connected to the first unit 110, electric power supply to the generator 111A can be prohibited.

In the above embodiment, the resistor 300 has a constant electrical resistance value. Alternatively, the resistor 300 may be a variable resistor. The electrical resistance value of the variable resistor continually or discontinuously varies depending on a depth (insertion length) that the second unit 130 is inserted into the first unit 110 in the predetermined direction A. The variable resistor of which electrical resistance value is varied discontinuously may be formed by a plurality of resistors, for example. In this case, the number of resistors electrically connected to the electric circuit electrically connected to the generator 111A is determined depending on the insertion length of the second unit 130.

When a variable resistor of which electrical resistance value is varied depending on the insertion length of the second unit 130 as described above, the combined resistance value Rc is changed depending on the insertion length of the second unit 130. Therefore, the controller 51 can detect the insertion length of the second unit 130 by detecting the combined resistance value Rc.

The controller 51 may control an amount of electric power E supplied to the resistance heating element 111R. A magnitude of the amount of electric power E supplied to the resistance heating element 111R is defined by a voltage value V1 applied to the resistance heating element 111R and time T1 at which the voltage is applied to the resistance heating element 111R. When, for example, a voltage is applied continually to the resistance heating element 111R, the magnitude of the amount of electric power supplied to the resistance heating element 111R is changed in accordance with the change in the voltage value applied to the resistance heating element 111R. On the other hand, when a voltage is applied intermittently to the resistance heating element 111R (pulse control), the magnitude of the amount of electric power supplied to the resistance heating element 111R is changed in accordance with the change of the value of the voltage applied to the resistance heating element 111R or the duty ratio (i.e., the pulse width and the pulse intervals). Depending on the magnitude of the amount of electric power supplied to the resistance heating element 111R, the amount of the inhalant ingredient generated by the generator 111A can be controlled.

The controller 51 may control the amount of electric power so that the amount of electric power E supplied to the resistance heating element 111R does not exceed a first threshold $E_{MAX}$. More specifically, for example, the controller 51 controls the amount of electric power so that the amount of electric power E supplied to the resistance heating element 111R exceeds a second threshold $E_{MIN}$. When the amount of electric power (applied time) reaches an $E_{MAX}$ ($T_{MAX}$), the controller 51 finishes electric power supply to the resistance heating element 111R.

The voltage value to be applied to the resistance heating element 111R may be changed depending on whether the second unit 130 has been connected to the first unit 110. In this case, the controller 51 desirably controls so that the amount of electric power E supplied to the resistance heating element 111B is kept to be constant.

The controller 51 desirably calculates a correction factor D in accordance with the expression of $D=V_c^2/V1^2$. More specifically, the controller 51 corrects the amount of electric power to supply to the resistance heating element 111R in accordance with the expression of $E=D \times V1^2/R1 \times T$. $V_c$ is a reference voltage value of the battery, which is previously determined value depending on the type of the battery, etc. $V_c$ is a voltage at least higher than the final voltage of the battery.

Correction of the voltage applied to the resistance heating element 111R is performed using, for example, a DC/DC converter. The DC/DC converter may be a step-down type converter or may be a step-up type converter.

Second Embodiment

Figure 4:
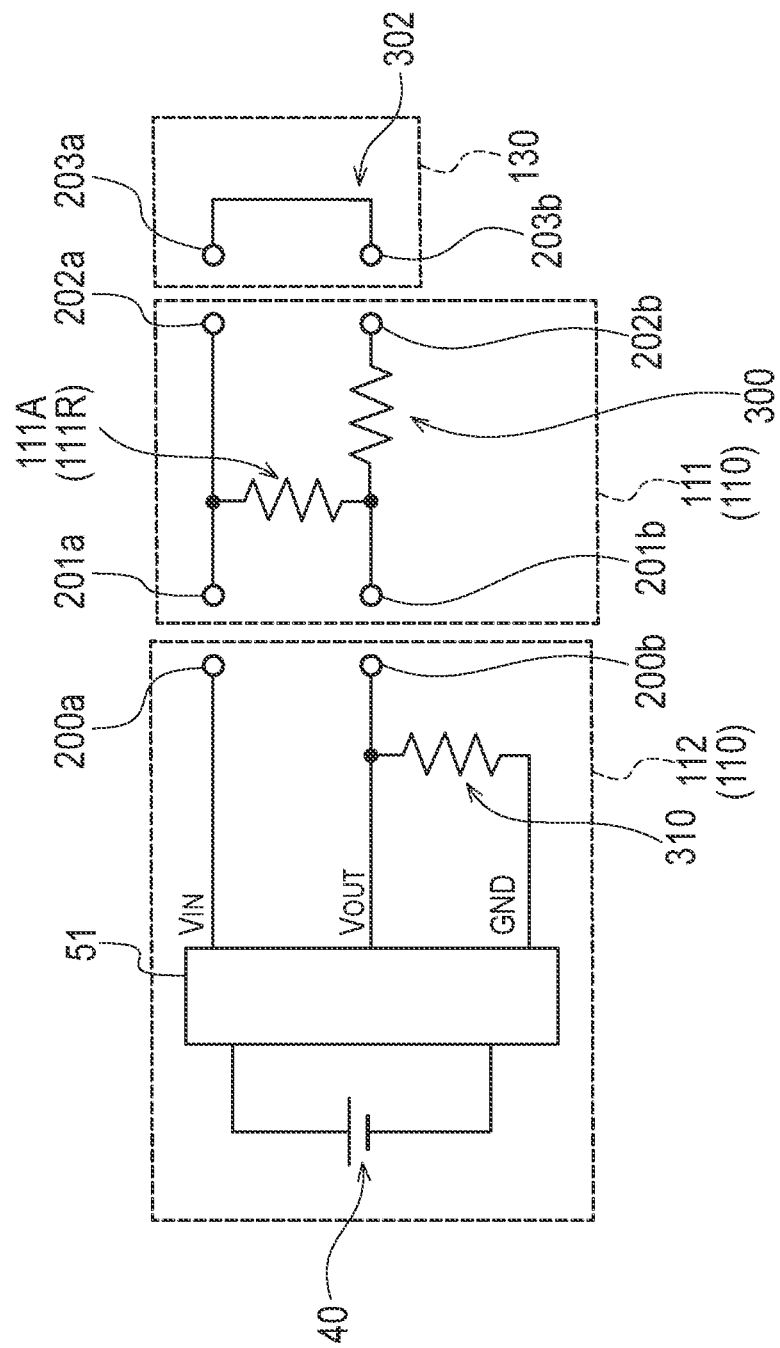
FIG. 4 is a diagram schematically illustrating an electric circuit provided in a non-combustion-type flavor inhaler according to a second embodiment.

Hereinafter, a second embodiment will be described with reference to FIG. 4. FIG. 4 is a diagram schematically illustrating an electric circuit of a flavor inhaler according to the second embodiment. The same configurations as those of the first embodiment will be denoted by the same reference numerals. Description of the same configurations as those of the first embodiment may be omitted.

The flavor inhaler 100 according to the second embodiment includes a resistor 300 that is conductively connected to a generator 111A in parallel when a second unit 130 is connected to a first unit 110. In particular, the flavor inhaler 100 includes an electrical path 302 that electrically connects the generator 111A and the resistor 300 in parallel, and a part of the electrical path 302 is provided in the second unit 130. The resistor 300 is provided on the second unit 130 side of the generator 111A on the electrical path 302. In the second embodiment, the resistor 300 is provided in the first unit 110.

A pair of electric terminals 203a and 203b of the second unit 130 is electrically connected to each other in an electrical resistance value smaller than an electrical resistance value of the resistor 300. For example, a pair of electric terminals 203a and 203b may be electrically connected to conducting wire or a metal plate, etc. No resistor is provided between the pair of electric terminals 203a and 203b. Therefore, the second unit 130 causes a pair of electric terminals 202a and 202b of the first unit 110 to be conductively connected with each other when the second unit 130 is connected to the first unit 110.

In the flavor inhaler according to the second embodiment, when the second unit 130 is connected to the first unit 110, the pair of electric terminals 202a and 203b are conductively connected with each other and an electric circuit including the resistor 300 is formed. Therefore, when the second unit 130 is connected to the first unit 110, the combined resistance value of the electric circuit connected to the electric terminal 200a and the electric terminal 200b of the battery unit 112 changes. Therefore, whether the second unit 130 has been connected to the first unit 110 can be detected in the same manner as in the first embodiment.

The flavor inhaler may become usable only when the second unit 130 is attached to the first unit 110, or may become usable only in the first unit 110.

In the second embodiment, the resistor 300 is connected to the electric terminal 202a or 202b of the first unit 110. Therefore, when the electric terminals 202a and 202b of the first unit 110 are inadvertently short-circuited in a state in which the second unit 130 is not attached to the first unit 110, the resistor 300 can function as a protecting means that prevents flowing of excessive electric current.

Third Embodiment

Figure 5:
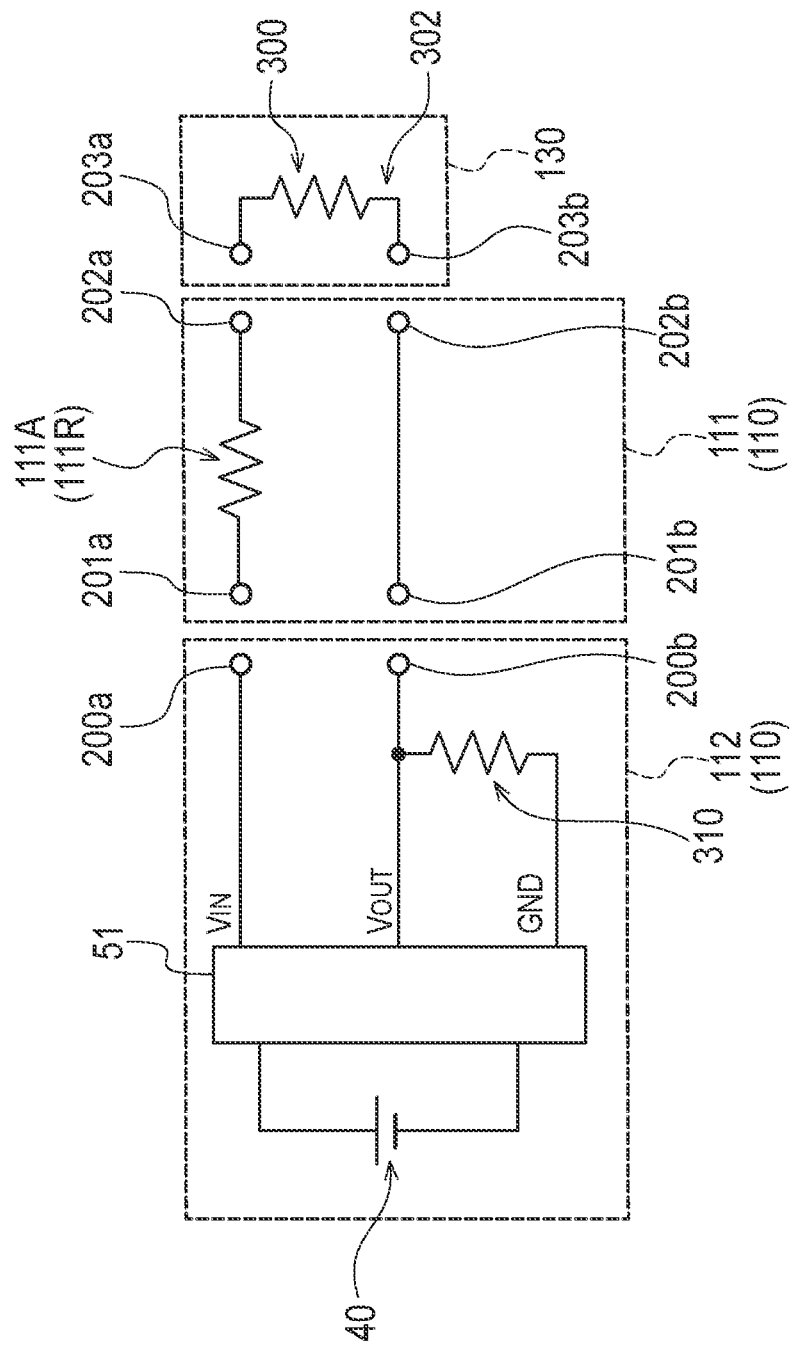
FIG. 5 is a diagram schematically illustrating an electric circuit provided in a non-combustion-type flavor inhaler according to a third embodiment.

Hereinafter, a third embodiment will be described. FIG. 5 is a diagram schematically illustrating an electric circuit of a flavor inhaler according to a third embodiment. The same configurations as those of the first embodiment will be denoted by the same reference numerals. Description of the same configurations as those of the first embodiment may be omitted.

A flavor inhaler 100 includes a resistor 300 that is conductively connected in series to a generator 111A when a second unit 130 is connected to a first unit 110. In particular, the flavor inhaler 100 includes an electrical path 302 that electrically connects the generator 111A and the resistor 300 in series, and a part of the electrical path 302 is provided in the second unit 130. The resistor 300 is provided in the second unit 130. The resistor 300 is connected to the generator 111A in series. Therefore, a value of an electric current flowing the generator 111A is substantially equal to a value of an electric current flowing the resistor 300.

As in the first embodiment, the flavor inhaler 100 is electrically connected in series with the generator 111A and the resistor 300, and may include a known resistor 310 having a known electrical resistance value. The known resistor 310 is desirably provided in a battery unit 112. A voltage equivalent to a difference between an output voltage $V_{OUT}$ of the generator 111A and a ground electrode is applied to the known resistor 310.

Figure 6:
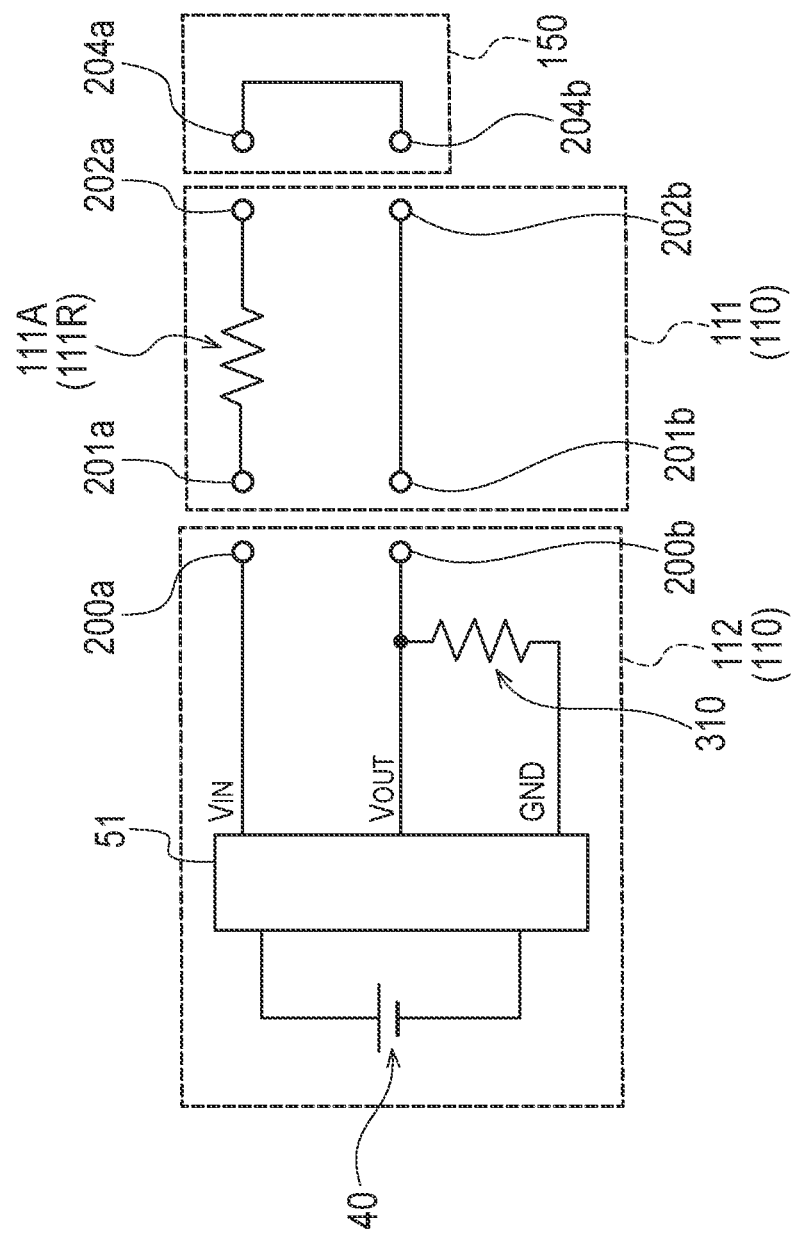
FIG. 6 is a diagram illustrating the third unit used instead of the second unit in the third embodiment.

As illustrated in FIG. 6, in a third embodiment, a flavor inhaler may include a third unit 150 that is not a detection target. The third unit 150 is used instead of the second unit 130. When the second unit 130 is not attached to the first unit 110, the third unit 150 is detachably connected to the first unit 110. The third unit 150 includes electric terminals 204a and 204b electrically connected to the electric terminals 202a and 202b of the first unit 110.

When the second unit 130 is not attached to the first unit 110, an electrical path on the first unit 110 side is opened at a pair of electric terminals 202a and 202b. The third unit 150 does not have a resistor between a pair of electric terminals 204a and 204b. Alternatively, the third unit 150 may cause a pair of electric terminals 202a and 202b to be conductively connected with each other with an electrical resistance value smaller than an electrical resistance value of the resistor 300 of the second unit 130.

The third unit 150 does not necessarily have to include a flavor source. The third unit 150 may be a lid that can be simply attached to the first unit 110. When the third unit 150 is provided on the mouthpiece end side, the third unit 150 may form the mouthpiece. In this case, the flavor inhaler 100 may be used without the second unit 130.

Detection of Connection of Second Unit

The controller 51 detects a connection between the first unit 110 and the second unit 130 based on a difference between the combined resistance value Rc of the generator 111A and the resistor 300 and the electrical resistance value R1 of the generator 111A. When the second unit 130 is connected to the first unit 110, an electrical resistance value of an electric circuit connected to the electric terminal 200a and the electric terminal 200b of the battery unit 112 is the combined resistance value Rc (>R1) of the electrical resistance value R1 of the generator 111A and the electrical resistance value R2 of the resistor 300. Therefore, the controller 51 can detect whether the second unit 130 has been connected to the first unit 110 based on a difference between the electrical resistance value R1 of the generator 111A and the combined resistance value Rc.

As a specific example, the controller 51 can detect whether the second unit 130 has been connected to the first unit 110 in the following manner. First, the controller 51 measures the electrical resistance value R1 of the generator 111A when the third unit 150 is connected to the first unit 110. The electrical resistance value R1 is stored in the memory of the controller 51. The controller 51 measures the electrical resistance value of the electric circuit connected to the electric terminal 200a and the electric terminal 200b at predetermined timing. The electrical resistance value becomes the above-described combined resistance value Rc (>R1) when the third unit is removed and the second unit 130 is connected to the first unit 110. When the controller 51 detects an electrical resistance value larger than the electrical resistance value R1, the controller 51 determines that the second unit 130 has been connected to the first unit 110. In consideration of measurement accuracy of the electrical resistance value, the controller 51 may determine that the second unit 130 has been connected to the first unit 110 when the controller 51 detects an electrical resistance value sufficiently larger than the electrical resistance value R1.

The timing at which the controller 51 measures the electrical resistance value of the electric circuit connected to the electric terminal 200a and the electric terminal 200b is desirably the timing at which a user performs an inhalation action. That is, the controller 51 measures the electrical resistance value when the sensor 20 detects an inhalation action.

Alternatively, as described above, when the user presses a switch for driving the generator 111A, when the mode is switched from the sleep mode to the ready mode, when an action for authenticating a user is performed, or at predetermined time intervals, the controller 51 may measure an electrical resistance value of an electric circuit connected to the electric terminal 200a and the electric terminal 200b. The electrical resistance value of the electric circuit connected to the electric terminal 200a and the electric terminal 200b may be measured in the same manner as in the first embodiment. The electrical resistance value R3 of the known resistor 310 may be in a range from 10 mΩ to 100 mΩ.

From the viewpoint of improving detection accuracy as to whether the second unit 130 has been connected, the larger the difference between the electrical resistance value R1 of the generator 111A and the combined resistance value Re is the better. From this viewpoint, a ratio of the electrical resistance value of the resistor 300 with respect to the electrical resistance value R1 of the generator 111A is preferably equal to or greater than 0.01, and more preferably equal to or greater than 0.05.

From the viewpoint of reducing electric power consumption during the user of the flavor inhaler 100, the smaller the electrical resistance value of the resistor 300 is the better. From this viewpoint, a ratio of the electrical resistance value of the resistor 300 with respect to the electrical resistance value R1 of the generator 111A is preferably equal to or smaller than 0.25, and more preferably equal to or smaller than 0.1.

Fourth Embodiment

Figure 7:
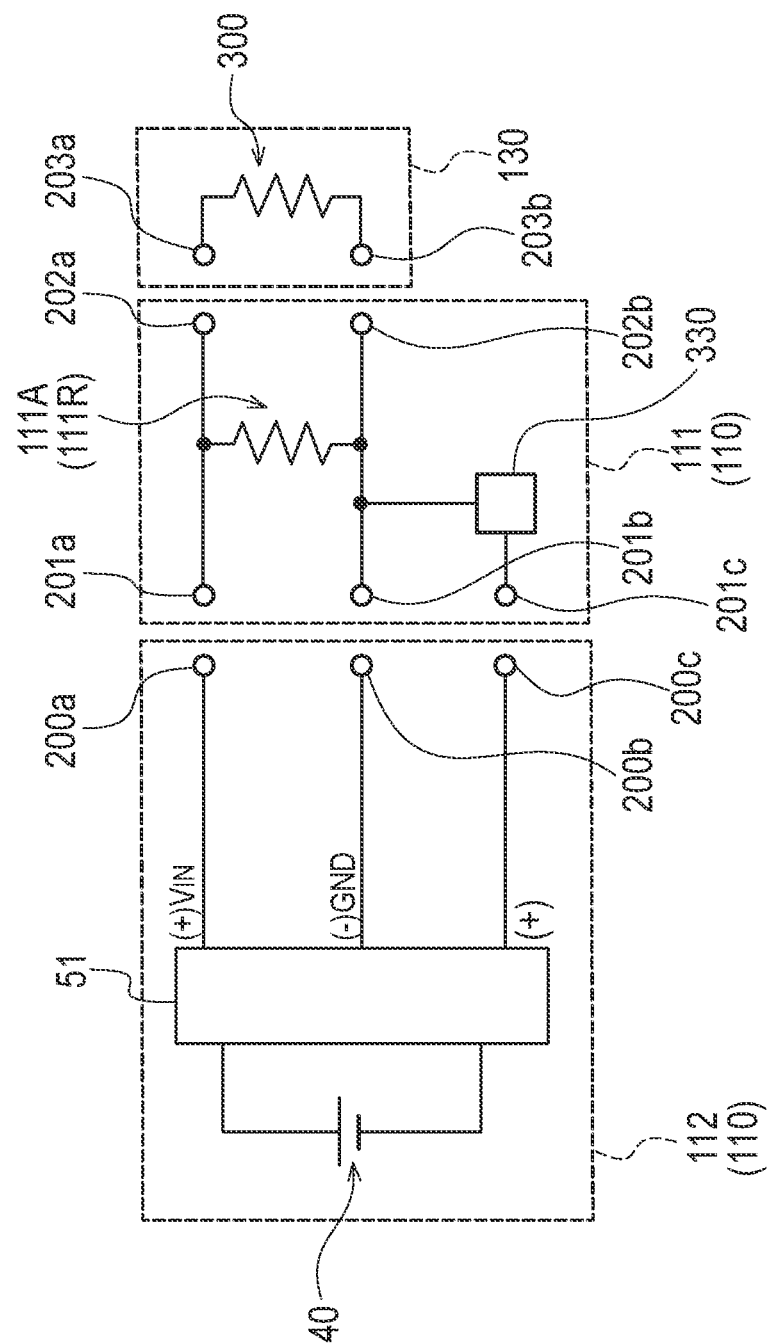
FIG. 7 is a diagram schematically illustrating an electric circuit provided in a non-combustion-type flavor inhaler according to a fourth embodiment.

Hereinafter, a fourth embodiment will be described with reference to FIG. 7. FIG. 7 is a diagram schematically illustrating an electric circuit of a flavor inhaler according to a fourth embodiment. The same configurations as those of the fourth embodiment will be denoted by the same reference numerals. Description of the same configurations as those of the fourth embodiment may be omitted.

In the fourth embodiment, a first unit 110, i.e., a generation unit 111 includes an information source 330 that holds an electrical resistance value R1 of the generator 111A or identification information correlated with an electrical resistance value R1 of the generator 111A. The information source 330 may be, for example, memory electrically connected to the controller 51.

More specifically, the generation unit 111 further includes an electric terminal 201c electrically connected to an anode of the battery 40. The electric terminal 201c is electrically connectable to an electric terminal 200c of the battery unit electrically connected to the controller 51. Memory is electrically connected to the battery 40 via electric terminals 201b and 201c of the generation unit 111 and the electric terminals 200b and 200c of the battery unit 112.

Detection of Connection of Second Unit

The controller 51 detects a connection between the first unit 110 and the second unit 130 based on a difference between the combined resistance value Rc of the generator 111A and the resistor 300 and the electrical resistance value R1 of the generator 111A.

As a specific example, the controller 51 can detect as to whether the second unit 130 has been connected to the first unit 110 in the following manner. The controller 51 measures the electrical resistance value of the electric circuit connected to the electric terminal 200a and the electric terminal 200b at predetermined timing. When the second unit 130 is connected to the first unit 110, the electrical resistance value becomes the combined resistance value Rc (<R1). Also, the controller 51 acquires the electrical resistance value R1 of the generator 111A recorded in the information source 330.

When the controller 51 detects an electrical resistance value smaller than the electrical resistance value R1 acquired from the information source 330, the controller 51 determines that the second unit 130 has been connected to the first unit 110. In consideration of measurement accuracy of the electrical resistance value, the controller 51 may determine that the second unit 130 has been connected to the first unit 110 when the controller 51 detects an electrical resistance value sufficiently smaller than the electrical resistance value R1.

According to the fourth embodiment, the controller 51 may desirably acquire the electrical resistance value R1 of the generator 111A from the information source 330, it is not necessary to measure the electrical resistance value R1 of the generator 111A.

Although not illustrated in FIG. 7, also in the fourth embodiment, the electrical resistance value of the known resistor 310 may be used to also measure the combined resistance value Rc of the electrical resistance value R1 of the generator 111A and the electrical resistance value of the resistor 300.

In the fourth embodiment, the information source 330 is memory electrically connected to the controller 51, and the memory stores the electrical resistance value R1 of the generator 111A. Alternatively, the memory may store identification information correlated with information of the electrical resistance value R1. In this case, the controller 51 desirably includes an outside access unit to access an external device like a communication terminal. The outside access unit may be, for example, a module for connecting to a communication terminal in a wired connection, or a module for connecting to a communication terminal in a wireless connection. The outside access unit reads identification information from memory 111M and acquires an electrical resistance value R1 of the generator 111A from the external device using the read identification information. The controller 51 can implement connection detection of the second unit 130 using the electrical resistance value R1.

In the fourth embodiment, the information source 330 is memory electrically connected to the controller 51. Alternatively, the information source 330 may be a medium provided in the generation unit 111 not electrically connected to the controller 51. The medium may be, for example, a paper medium on which identification information is displayed, e.g., a label to be attached outside the generation unit 111. Also, in this case, the controller 51 desirably includes an outside access unit that accesses the external device like a communication terminal. The external device acquires identification information from a paper medium by inputting identification information or reading identification information. Through the outside access unit, the controller 51 acquires information correlated with the identification information from the external device, that is, the electrical resistance value R1 of the generator 111A. The controller 51 may perform a connection detection of the second unit 130 using the electrical resistance value R1.

Fifth Embodiment

Figure 8:
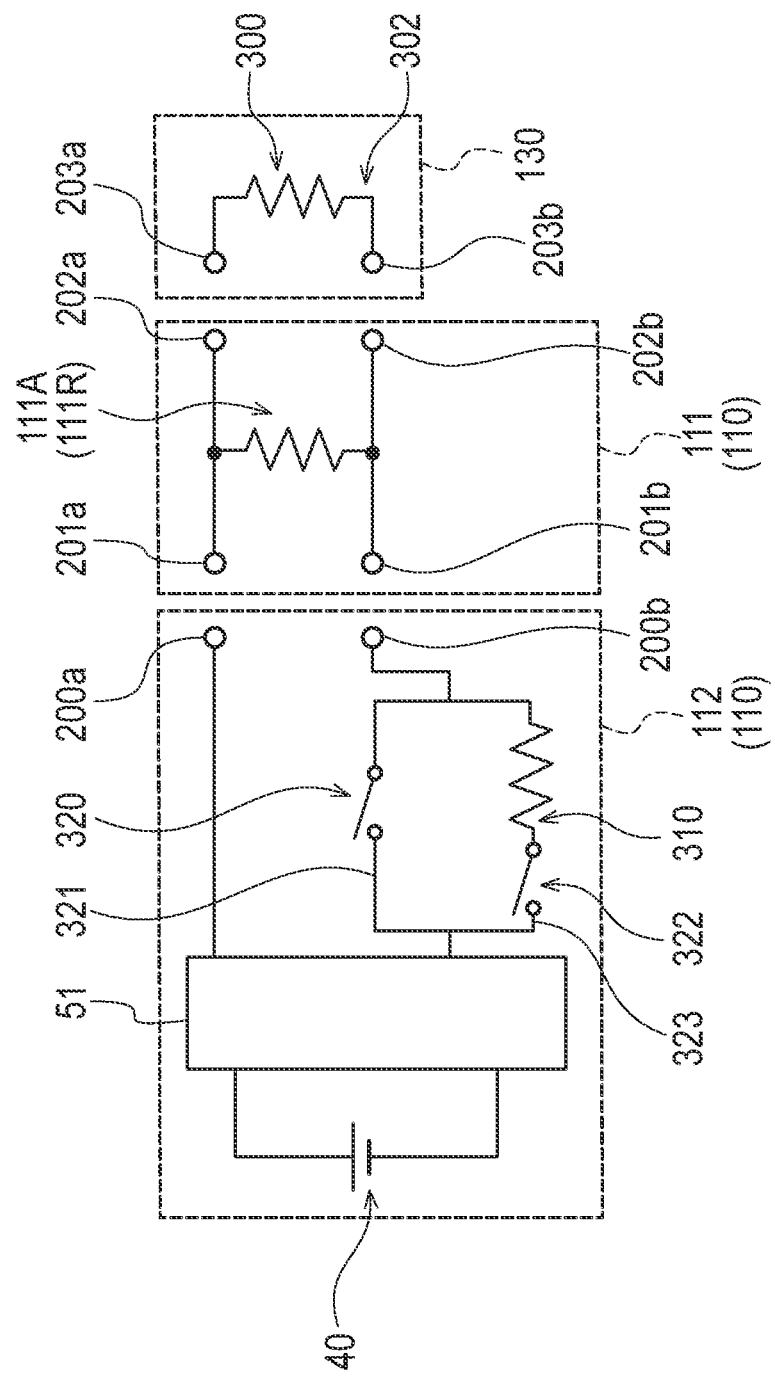
FIG. 8 is a diagram illustrating an electric circuit provided in a non-combustion-type flavor inhaler according a fifth embodiment.

Hereinafter, a fifth embodiment will be described with reference to FIG. 8. FIG. 8 is a diagram schematically illustrating an electric circuit of a flavor inhaler according to the fifth embodiment. The same configurations as those of the first embodiment will be denoted by the same reference numerals. Description of the same configurations as those of the first embodiment may be omitted.

A flavor inhaler 100 may include an amplifier circuit (not illustrated) like an operational amplifier for amplifying a potential difference between both ends of a known resistor 310.

The flavor inhaler 100 includes a known resistor 310 which is the same as that illustrated in the first embodiment. In the fifth embodiment, the flavor inhaler 100 includes a first electric current path 321 that generates an inhalant ingredient from an inhalant ingredient source, a second electric current path 323 that measures an electrical resistance value of a generator 111A or a combined resistance value of the generator 111A and a resistor 300, and a switch means that can switch between the first electric current path 321 and the second electric current path 323 for selectively flowing an electric current therethrough. A specific configuration of the switch means is not particularly limited. A known resistor 310 similar to that described in the first embodiment may be arranged in the second electric current path 323.

The switch means includes, as a specific example, a first switch 320, and a second switch 322 connected to the first switch 320 in parallel. The second switch 322 is connected to the known resistor 310 in series. The first switch 320 and the second switch 322 may be, for example, an on/off switch. Switching between the first switch 320 and the second switch 322 is performed using the controller 51.

When measuring the electrical resistance value of the generator 111A or the combined resistance value of the generator 111A and the resistor 300, the controller 51 may desirably flow the electric current on the second electric current path 323 by opening the first switch 320 and closing the second switch 322. Therefore, the resistance value can be measured using the known resistor 310.

When supplying electric power to the generator 111A to generate the inhalant ingredient source, the controller 51 may desirably flow the electric current on the second electric current path 322 by closing the first switch 320 and opening the second switch 322. Therefore, since no electric current flows in the known resistor 310 when supplying electric power to the generator 111A, loss of electric power can be reduced.

Timing at which the controller 51 measures the electrical resistance value of the electric circuit connected to the electric terminal 200a and the electric terminal 200b, that is, timing at which the controller 51 measures the electrical resistance value of the generator 111A or the combined resistance value of the generator 111A and the resistor 300 has been described in the first embodiment.

Figure 9:
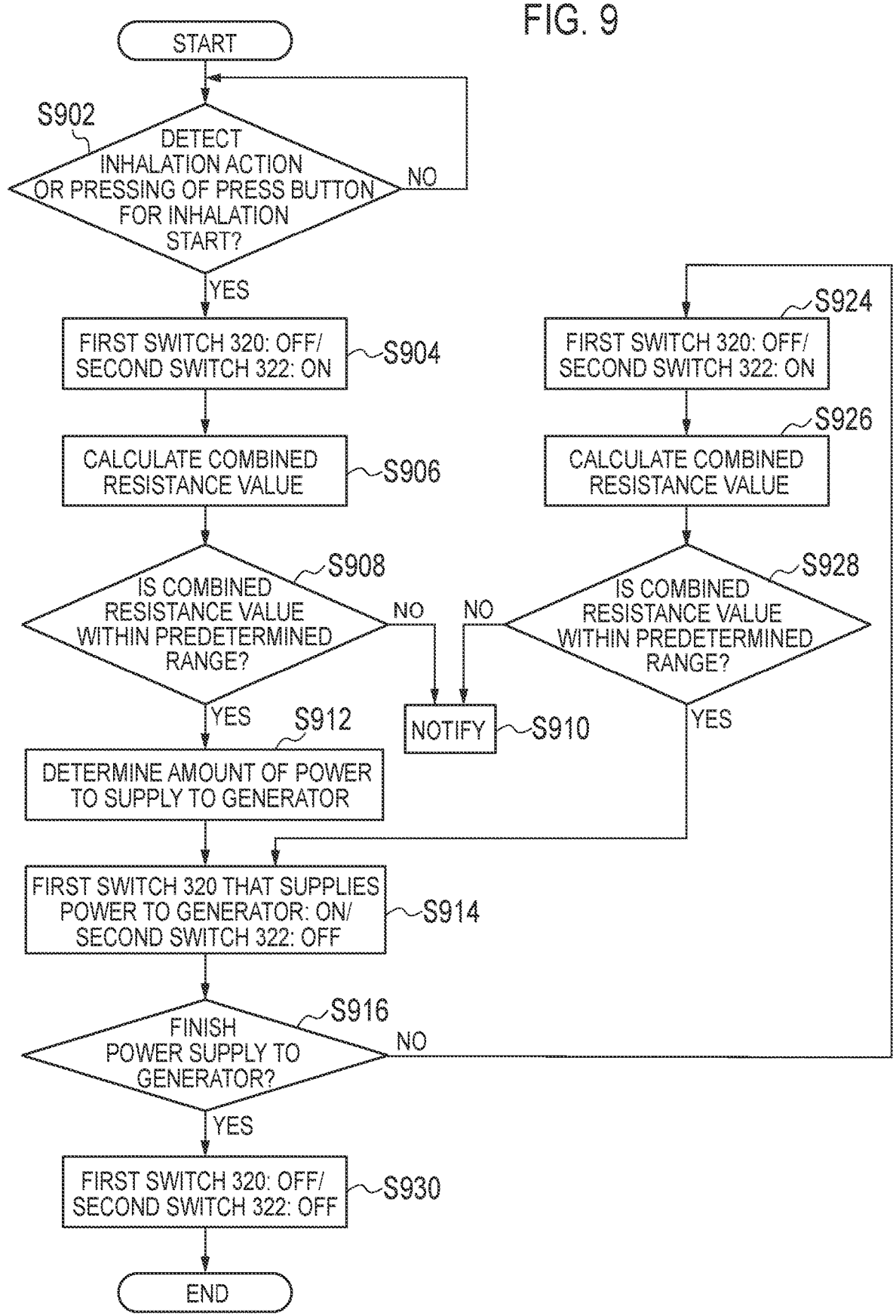
FIG. 9 is a flow diagram illustrating an example of an operation of the non-combustion-type flavor inhaler according to the fifth embodiment.

FIG. 9 is a flow diagram illustrating inhalation of the inhalant ingredient by a user. First, immediately after the sensor 20 detects the inhalation action by the user, or immediately after a press button for starting inhalation is pressed, the controller 51 opens the first switch 320 and closes the second switch 322 (step S902, S904). The controller 51 calculates the electrical resistance value of the electric circuit connected to the electric terminal 200a and the electric terminal 200b (the combined resistance value) the first switch 320 and the second switch 322 being closed (step S906). When the calculated electrical resistance value is in a predetermined range, i.e., in a range similar to the combined resistance value of the generator 111A and the resistor 300, the controller 51 determines that the second unit 130 is connected normally (step S908). When the calculated electrical resistance value is out of a predetermined range, the controller 51 determines that the second unit 130 is not connected normally and the user is notified (step S910). At that time, a state in which the first switch 320 is opened is kept. Notification to the user may be performed by, for example, using the above-described notification means.

After it is determined that the second unit 130 is connected normally, the controller 51 determines the amount of electric power to supply to the generator 111A based on the electrical resistance value calculated in step S906 (step S912), and closes the first switch 320 and opens the second switch 322 (step S914). Therefore, electric power supply to the generator 111A is started and the inhalant ingredient source is generated from the generator 111A.

After electric power supply to the generator 111A is started, it is determined as to whether electric power supply is finished (step S916). Finish of electric power supply is determined by, for example, whether finish of the inhalation action by the user is detected, whether pressing of the press button by the user is released, whether a certain period of time elapsed since electric power supply is started, whether a predetermined amount of electric power has been supplied to the generator 111A, and the like. When the controller 51 determines to finish the electric power supply, the controller 51 opens the first switch 320 and the second switch 322, and finishes the electric power supply (step S930).

When it is determined that the controller 51 does not finish electric power supply, electric power supply to the generator 111A is continued. The controller 51 may calculate the electrical resistance value (the combined resistance value) of the electric circuit periodically connected to the electric terminal 200a and the electric terminal 200b during electric power supply to the generator 111A. More specifically, the controller 51 opens the first switch 320 and closes the second switch 322 (step S924), and calculates the electrical resistance value (the combined resistance value) of the electric circuit connected to the electric terminal 200a and the electric terminal 200b (step S926). When the calculated electrical resistance value is within a predetermined range, the controller 51 closes the first switch 320 and opens the second switch 322 (step S914) and continues electric power supply to the generator 111A. When the calculated electrical resistance value is out of a predetermined range, the controller 51 keeps the first switch 320 opened and notifies the user (step S910).

Timing at which the controller 51 measures the electrical resistance value of the electric circuit connected to the electric terminal 200a and the electric terminal 200b, that is, timing at which the controller 51 measures the electrical resistance value of the generator 111A or the combined resistance value of the generator 111A and the resistor 300 is not limited to the timing illustrated in the flow diagram in FIG. 9. For example, the controller 51 may measure the electrical resistance value of the generator 111A or the combined resistance value of the generator 111A and the resistor 300 when the mode of the mode is switched from a sleep mode (a electric power-saving mode) in which no electric conduction of the generator 111A is allowed in to a ready mode in which the generator 111A is controllable. As another example, when the flavor inhaler has a user authentication function, the controller 51 may measure the electrical resistance value of the generator 111A or the combined resistance value of the generator 111A and the resistor 300 at timing at which an action for the user authentication is performed.

Other Embodiments

The present invention has been described with reference to the above embodiments. However, it is not to be understood that discussion and drawings that are parts of the disclosure of the invention are limiting the invention. Various alternative embodiments, examples, and operational techniques will become obvious to those skilled in the art from the described embodiments.

For example, configurations described in each of the above embodiments may be combined and/or rearranged as much as possible.

A program for executing a method by the controller 51 described in each of the above embodiments may also be within the range of the invention. The program may be stored in a recording medium. The recording medium storing the program may be a non-transient recording medium.

In the above embodiments, the second unit 130 includes the flavor source 132. Alternatively, the second unit 130 may include a generator of the same configuration as that of the generator 111A. In that case, a flavor inhaler having a plurality of aerosol sources can be provided.

The second unit 130 may also be a mouthpiece unit including a mouthpiece. The mouthpiece unit may or may not include the flavor source 132.

In the above embodiments, the resistor 300 substantially does not contribute to heating of the flavor source. Alternatively, the resistor 300 may be a resistance heating element used to heat the flavor source. In this case, the resistance heating element may be wound around the cylindrical body 131. Furthermore, the cylindrical body 131 is desirably formed by a thermal conductive member.

When the resistor 300 is a resistance heating element used to heat the flavor source, the cylindrical body 131 itself may be formed by a material that functions as the resistor 300 having a predetermined electrical resistance value.

When the resistor 300 is a resistance heating element used to heat the flavor source, the resistance heating element desirably is a resistance heating element that does not substantially contribute to the generation of aerosol from the flavor source. The flavor source is desirably heated at a temperature lower than either of a boiling point of the flavor ingredient contained in the flavor source or a thermal decomposition temperature of the flavor source. In particular, a heating temperature of the flavor source with the resistance heating element is desirably 150 degrees C. or below.

The flavor inhaler may include a light emitting element, e.g., LED. The light emitting element may be electrically connected to the controller 51. In this case, the flavor inhaler may notify that the second unit 130 is connected to the first unit 110 with light-emitting modes of the light emitting element.

The flavor inhaler may start driving of the generator 111A based on the sensor 20 detecting the press button or inhalation by the user.

The invention claimed is:

1. A non-combustion-type flavor inhaler comprising:
a first unit including a battery configured to store electric power, a generator configured to generate an inhalant ingredient from an inhalant ingredient source by electric power provided from the battery, and a controller configured to electrically control the generator;
a second unit configured to detachably connect to the first unit; and
a resistor configured to conductively connect to the generator by parallel connection or serial connection when the second unit is connected to the first unit, wherein
the controller is configured to detect a connection between the first unit and the second unit based on a difference between an electric resistance value of the generator and a combined resistance value of the generator and the resistor.

2. The non-combustion-type flavor inhaler according to claim 1, wherein
the generator of the first unit includes an aerosol source configured to generate aerosol, and
the second unit includes a flavor source configured to generate flavor.

3. The non-combustion-type flavor inhaler according to claim 2, wherein
the aerosol source is a liquid at ordinary temperatures, and the flavor source is a solid at ordinary temperatures.

4. The non-combustion-type flavor inhaler according to claim 2, wherein
the aerosol source contains polyhydric alcohol, and
the flavor source contains a plant material.

5. The non-combustion-type flavor inhaler according to claim 1, wherein
the controller is configured to perform control of an amount of electric power to supply to the generator or notification control of a notification means provided in the non-combustion-type flavor inhaler, after detecting a connection between the first unit and the second unit.

6. The non-combustion-type flavor inhaler according to claim 1, wherein
an electrical resistance value of the generator is different from an electrical resistance value of the resistor.

7. The non-combustion-type flavor inhaler according to claim 1, further comprising
an electrical path configured to electrically connect the resistor and the generator in parallel, wherein
a part of the electrical path is provided in the second unit, and
in the electrical path, the resistor is provided on the second unit side of the generator.

8. The non-combustion-type flavor inhaler according to claim 7, wherein
the resistor is provided in the second unit.

9. The non-combustion-type flavor inhaler according to claim 7, wherein
a ratio of the electrical resistance value of the resistor with respect to the electrical resistance value of the generator is 5 to 100.

10. The non-combustion-type flavor inhaler according to claim 1, further comprising
an electrical path configured to electrically connect the generator and the resistor in series, wherein
a part of the electrical path is provided in the second unit, and
the resistor is provided in the second unit.

11. The non-combustion-type flavor inhaler according to claim 10, wherein
a ratio of the electrical resistance value of the resistor with respect to the electrical resistance value of the generator is 0.01 to 0.25.

12. The non-combustion-type flavor inhaler according to claim 10, further comprising
a third unit configured to detachably connect to the first unit when the second unit is not attached to the first unit, the third unit being not a detection target, wherein
when the second unit is not attached to the first unit, the electrical path on the first unit side is opened at a pair of electric terminals, and
the third unit is configured to cause the pair of electric terminals to conductively connect with each other with an electrical resistance value smaller than an electrical resistance value of the resistor.

13. The non-combustion-type flavor inhaler according to claim 1, wherein
the generator includes a resistance heating element.

14. The non-combustion-type flavor inhaler according to claim 1, further comprising
a known resistor configured to electrically connect to the generator and the resistor in series, the known resistor having a known electrical resistance value, wherein the controller is configured to estimate the combined resistance value using an electrical resistance value of the known resistor.

15. The non-combustion-type flavor inhaler according to claim 2, wherein
the resistor is segmented from a retainer retaining the flavor source.

16. The non-combustion-type flavor inhaler according to claim 2, wherein
the resistor does not substantially contribute to aerosol generating from the flavor source.

17. The non-combustion-type flavor inhaler according to claim 2, wherein
the resistor does not substantially contribute to heating of the flavor source.

18. The non-combustion-type flavor inhaler according to claim 1, wherein
the first unit includes an information source configured to hold an electrical resistance value of the generator or identification information correlated with an electrical resistance value of the generator.

19. The non-combustion-type flavor inhaler according to claim 1, wherein
the controller is configured to prohibit electric power supply to the generator when a difference between the combined resistance value and an electrical resistance value of the generator is equal to or smaller than a predetermined threshold.

20. The non-combustion-type flavor inhaler according to claim 1, wherein
the first unit includes a generation unit and a battery unit, the generation unit including at least the generator, the battery unit including at least the battery, and
the generation unit is configured to detachably connect to the battery unit.

21. The non-combustion-type flavor inhaler according to claim 20, wherein
the generation unit includes a first electrode electrically connected to a cathode of the battery and a second electrode electrically connected to an anode of the battery, and
the generator and the resistor are electrically connected to the battery via the first electrode and the second electrode.

22. The non-combustion-type flavor inhaler according to claim 21, wherein
the generation unit includes a third electrode electrically connected to the cathode of the battery, and memory storing information indicating the electrical resistance value of the generator, and
the memory is electrically connected to the battery via the third electrode and the second electrode.

23. The non-combustion-type flavor inhaler according to claim 1, wherein
the second unit includes a mouthpiece.

24. The non-combustion-type flavor inhaler according to claim 1, further comprising:
a first electric current path configured to generate the inhalant ingredient from the inhalant ingredient source;
a second electric current path configured to measure an electrical resistance value of the generator, or a combined resistance value of the generator and the resistor; and
an electric switch configured to be switchable between the first electric current path and the second electric current path for selectively flowing an electric current therethrough.

25. A method for detecting a connection of a first unit and a second unit in a non-combustion-type flavor inhaler that comprise the first unit and the second unit, the first unit including a generator configured to generate an inhalant ingredient from an inhalant ingredient source, the second unit detachably connecting to the first unit, the method comprising:
detecting a connection between the first unit and the second unit based on a difference between an electrical resistance value of the generator and a combined resistance value of the generator and a resistor conductively connected in parallel or in series to the generator when the second unit is connected to the first unit.

26. A program that causes a non-combustion-type flavor inhaler to execute the method according to claim 25.

27. A non-transitory computer-readable medium that stores a program for executing the method according to claim 25.

* * * * *